United States Patent [19]
MacDonald et al.

[11] Patent Number: 5,202,748
[45] Date of Patent: Apr. 13, 1993

[54] IN SITU PROCESS CONTROL SYSTEM FOR STEPPERS

[75] Inventors: Bruce G. MacDonald, San Diego; Robert O. Hunter, Jr., Rancho Santa Fe; Adlai H. Smith, San Diego, all of Calif.

[73] Assignee: Litel Instruments, San Diego, Calif.

[21] Appl. No.: 711,869

[22] Filed: Jun. 7, 1991

[51] Int. Cl.$^5$ .............................................. G01B 9/02
[52] U.S. Cl. ..................................... 356/360; 356/72; 356/363
[58] Field of Search ............... 356/358, 359, 360, 363, 356/72, 73

[56] References Cited
U.S. PATENT DOCUMENTS

| | | | |
|---|---|---|---|
| 4,669,866 | 6/1987 | Phillips | 356/358 |
| 4,682,025 | 7/1987 | Livingston et al. | 356/363 |

FOREIGN PATENT DOCUMENTS

| | | | |
|---|---|---|---|
| 0100005 | 6/1985 | Japan | 356/358 |
| 0208703 | 8/1988 | Japan | 356/363 |
| 0002504 | 1/1991 | Japan | 356/358 |

*Primary Examiner*—Samuel A. Turner
*Attorney, Agent, or Firm*—Brown, Martin, Haller & McClain

[57] ABSTRACT

The in situ process control system includes a full aperture sensor for observing the wafer through the optical train. A reference laser is provided and directed through the optical train to the wafer which partially reflects the reference beam back to an interferometer, with interference fringes being detected by the full aperture sensor. The interferometer provides a map of optical path difference before and during exposure which is then used by the control processor to monitor and control wafer warpage, aberration and distortions due to thermal effects and prior process steps. The reference laser may have multiple wavelengths to differentiate between the photoresist and the underlying layer on the wafer. Backscattered light from the wafer back through the optical train and the mask or mask plane is used to monitor exposure realtime. This monitor collects data on the actual delivered irradiance and stores it in the control processor, the data being used to determine resist characteristics, focus characterization, pattern definition, registration and alignment. The control processor receives information from the interferometers and other sensors and, using a library of algorithms, adapts the stepper to the desired characteristics by causing changes in focus, mask manipulation, wafer chuck manipulation, etc.

30 Claims, 6 Drawing Sheets

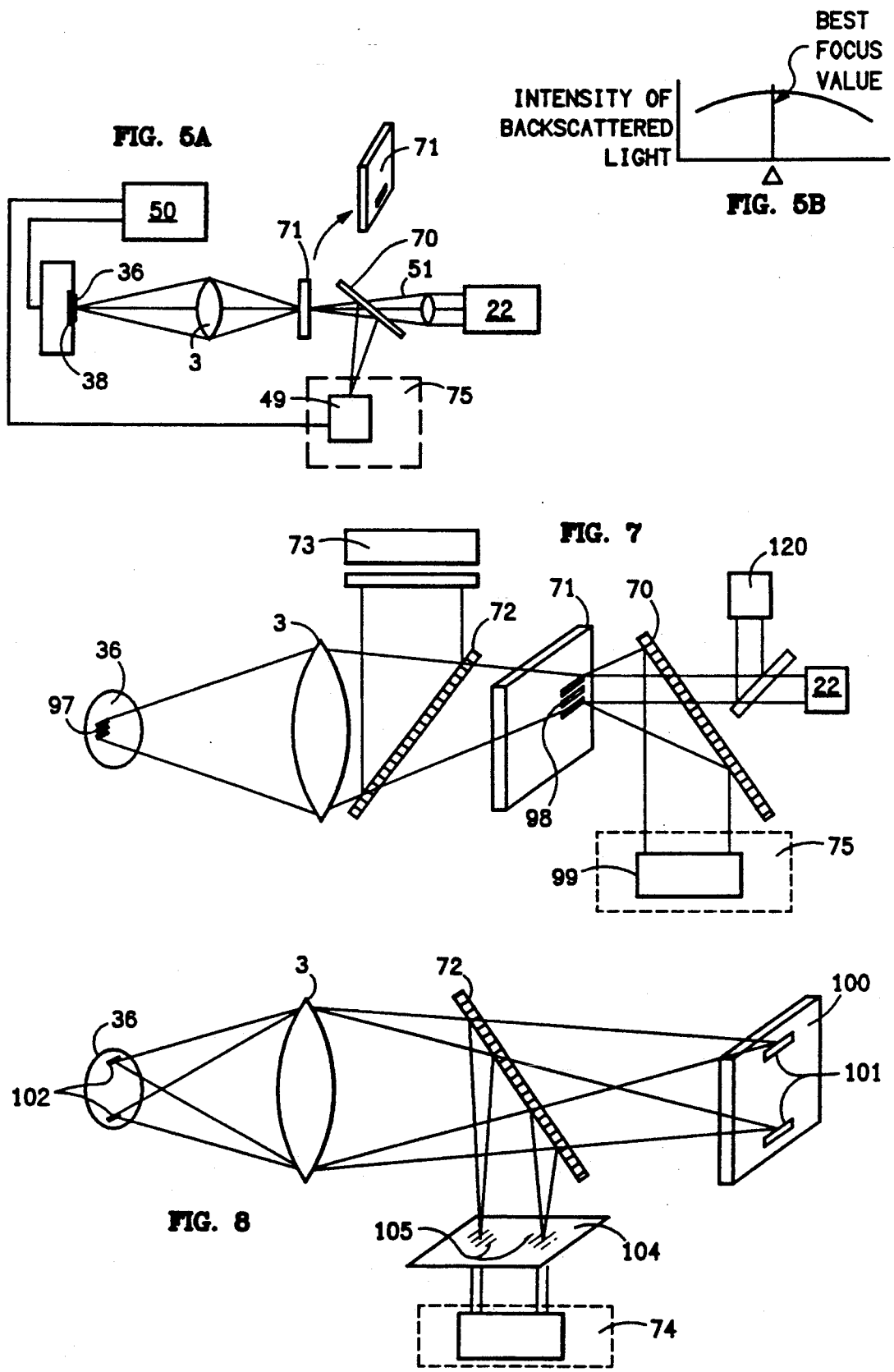

IN SITU PROCESS CONTROL SYSTEM FOR STEPPERS

BACKGROUND OF THE INVENTION

Lithography is a key factor in the drive for higher levels of micro-circuit integration. Dynamic RAMs have quadrupled in the level of integration every three years as a result of the reduction in minimum geometries and increases in chip size. As minimum geometries approach 0.5 μm and below, lithography alternatives include optics, electron beam direct write, X-ray and electron/ion beam proximity technologies. The latter three technologies are still in their infancy relative to optical lithography and still have obstacles to overcome, including decreased throughput, low source brightness and mask complexity, respectively.

While optical lithography continues to be the dominant technology because it is well established and is capable of implementing sub-micron resolution at least as low as 0.35 μm, efforts into attaining smaller geometries are looking toward the newer technologies. In both optical lithography and its alternatives, progress into the realm of shorter wavelengths introduces increased sensitivities to minute surface imperfections including contaminants on optical surfaces, aberrations introduced by lenses and mirrors, photoresist thickness and surface variations and wafer flatness and planarity.

An area that significantly limits present lithographic technique as well as future technology is that of monitoring and control of exposure and alignment.

The most common practice is to coat an entire lot of wafer then expose one or two lead wafers at the last known good exposure time for that mask level on that particular stepper. After develop, the lead wafers are measured and inspected for pattern quality, critical dimensions (CDs) and alignment. If the lead wafers are within specification, the remainder of the lot is processed at the same exposure. If the lead wafers are out of specification, another lead wafer is run at a higher or lower exposure depending on whether the CDs on the first lead wafers were high or low, respectively. This trial-and-error process results in yield reduction because the first lead wafers may be out of specification. Further, if the lead wafer is not representative of the lot, for example, the film being patterned is of a different color due to different thickness, the entire lot may receive an incorrect exposure. The photoresist must then be stripped from the wafers and the processing at that mask level must be repeated. Reworks also often result in yield reduction.

Additional limitations in the area of lithography are experienced due to uniqueness of the optical train for each individual stepper. Although two or more steppers may theoretically be identical machines, optical corrections are tailored for each machine, or each machine may react differently to environmental conditions, causing each machine to have its own unique aberrations and distortions. For this reason, once a lot is started it often must be processed through the same stepper at every subsequent mask level, which can significantly diminish throughput.

In co-pending applications for "Adaptive Optic Wafer Stepper Illumination System" (Ser. No. 07/609,888, filed Nov. 5, 1990), "Deformable Wafer Chuck" (Ser. No. 07/609,816, filed Nov. 5, 1990), and "Illumination System with Asphenzation and Aberration Correction by Phase Steps" (Ser. No. 07/609,830, filed Nov. 5, 1990) the inventors disclose the use of an interferometric system for realtime monitoring and control of aberrations, distortion and wafer flatness. It would be desirable to provide a process control system applicable to any type of stepper which permits in situ monitoring of the illumination pattern and the wafer, and provides corrections to ensure correct exposure. It is to such a system that the present invention is directed.

SUMMARY OF THE INVENTION

It is an advantage of the present invention to provide realtime in situ monitoring in detail of the illumination pattern and the work piece being irradiated so that errors may be readily detected.

It is a further advantage of the invention to provide optical and work piece correction to ensure that the exposure is of high quality and within the specified limits.

It is still another advantage of the present invention to provide monitoring and/or control for all types of steppers including existing refractive optic systems.

In an exemplary embodiment, the in situ process control system includes a full aperture sensor for observing the wafer through the optical train. A reference laser is provided and directed through the optical train to the wafer which partially reflects the reference beam back to an interferometer, with interference fringes being detected by the full aperture sensor. The interferometer provides a map of optical path difference before and during exposure which is then used by the control processor to monitor and control wafer warpage, aberration and distortions due to thermal effects and prior process steps. The reference laser may have multiple wavelengths to differentiate between the photoresist and the underlying layer on the wafer.

Backscattered light from the wafer back through the optical train and the mask or mask plane is used to monitor exposure in real time. This monitor collects data on the actual delivered irradiance and stores it in the control processor, the data being used to determine resist characteristics, focus characterization, pattern definition, registration and alignment. The reflected image may be observed by the operator and/or stored. This provides direct monitoring of the irradiation as seen at the surface and as related to interferometric imagery. For data collection, for whole pattern monitoring, film or a similar photographic process can be used for a permanent record. A CCD camera can look at about $10^6$ elements of the $10^{10}$ element field, selectively recording information in the exposure field.

In addition to or as an alternate of the above interferometric system, a separate interferometer looks at the wafer only, without passing through the optical train. Multiple wavelengths may be used to monitor the photoresist surface as well as the wafer. When both interferometric systems are used it is possible to distinguish between changes in the optical train versus changes in the wafer.

The control processor receives information from the interferometers and other sensors and, using a library of algorithms, adapts the stepper to the desired characteristics by causing changes in focus, mask manipulation, wafer chuck manipulation, etc.

A fiducial alignment system is included to permit monitoring of the field relative to the die.

Depth of focus and feature size may be varied by software which will direct a change in wafer chuck manipulation and exposure time, respectively. This is particularly useful when the system is operated to expose sub-fields where parts of the field are sequentially illuminated by the laser. The exposure beam and the wafer flatness may be locally matched to the desired focal characteristics.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which:

FIGS. 5a and 5b are a diagrammatic view of the elements of a second embodiment of the backscatter subsystem used for focus determination;

FIG. 7 is a diagrammatic view of the elements of the backscatter subsystem for fine alignment;

FIG. 8 is a diagrammatic view of elements used for critical dimension determination;

DETAILED DESCRIPTION OF THE PREFERRED EMBODIMENT

For illustration purposes, the process control system is used to monitor a reflective optic stepper with a deformable wafer chuck and a deformable turning mirror. It should be noted that the process control system of the present invention may be used with any type of stepper optics, refractive, reflective or a combination of the two. For many of the descriptions of the backscatter subsystem, lens 3 is used to indicate the projection optics of any type of stepper.

Figure 1:
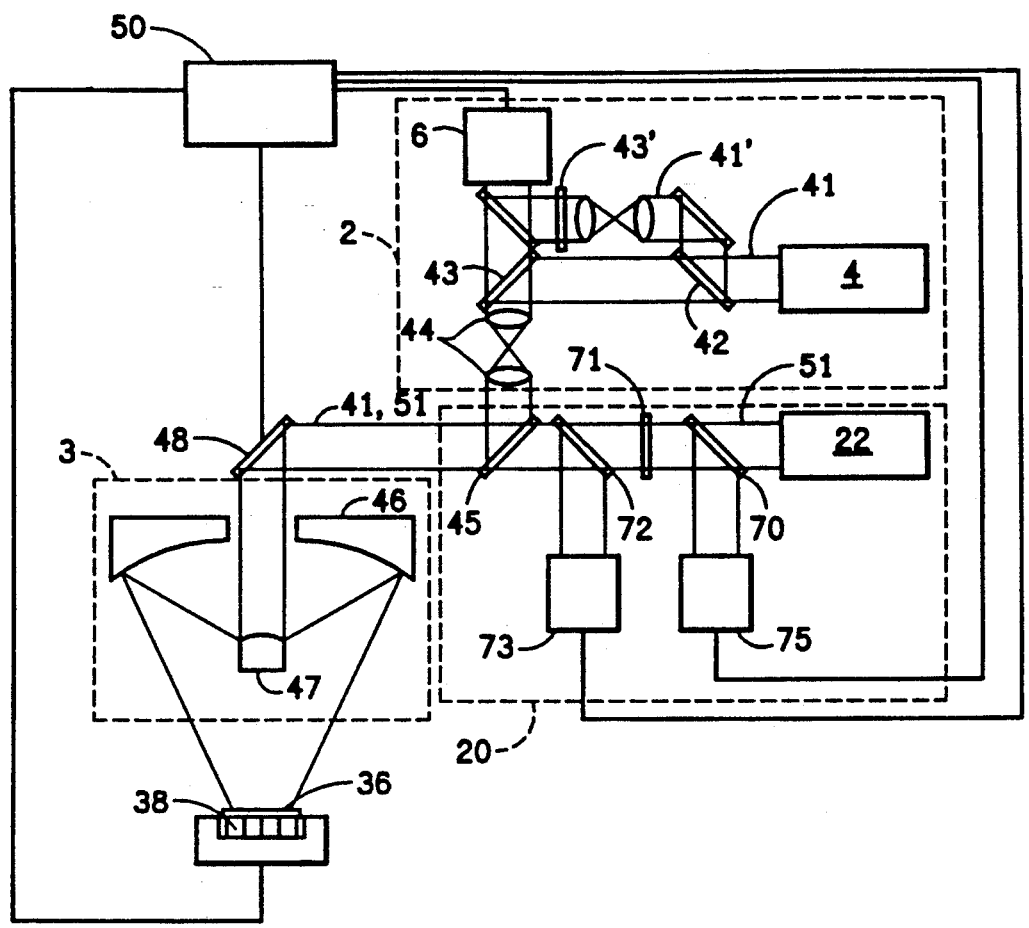
FIG. 1 is a diagrammatic view of a reflective stepper with a monitoring system according to the present invention.

As shown in FIG. 1, the process control system consists of the basic elements of an 1) interferometric subsystem 2 including reference laser 4, full aperture sensor or camera 6 and a plurality of beamsplitting and focusing optical elements; 2) a backscatter subsystem 20 including illumination laser 22, various alignment and reference marks on reticle 71, detectors 73 and 75; and 3) control processor 50 which receives signals from the cameras and detectors of each subsystem and performs comparisons to preprogrammed controls to determine whether adjustment of the variable parameters is desired. Where applicable, the computer then provides signals to manipulate the adjustable components of the stepper, such as deformable turning mirror 48 or deformable wafer chuck 38. The deformable turning mirror 48 and deformable wafer chuck 38 are deformed by selective activation of a plurality of piezoelectric actuators.

Describing the system in greater detail, interferometric system 2 includes reference laser 4 which emits light in the visible spectrum, such as helium-neon. (632.8 nm). Lasers emitting at two different wavelengths may be used to differentiate between the photoresist and the substrate surfaces by reflecting separately from each surface. The beam 41 from reference laser 4 is projected through a beamsplitter 42 which directs a portion 41' of incident beam 41 toward camera 6, which consists of an array of detectors where each detector comprises a pixel. The remainder of beam 41 is directed by beamsplitter 43 through focusing lenses 44 to beamsplitter 45 which redirects the beam 41 to be superimposed on beam 51 from illumination laser 22 into the optical train including primary mirror 46 and secondary mirror 47. A deformable turning mirror 48 is also included within the optical train for manipulation of the beams 41 and 51 to correct for aberrations in their wavefronts. The optical train focuses the beams onto the wafer 36 which is mounted on deformable wafer chuck 38.

Since the face of the wafer 36 is at least partially reflective, beam 41 is scattered back into the optical train and into the optical path. Beamsplitter 45 directs the reflected or backscattered light 41 through beamsplitter 43 to the surface of the camera 6 where a portion of it combines with incident beam 41 after beamsplitting through the other arm (the path of beam 41') to create an interference fringe pattern. The phase modulator 43' in the path of beam 41' is utilized to generate a phase map by inserting fractional wave steps in the reference arm (the path of beam 41'). Phase modulator 43' is an electro-optic device or piezoelectric driven mirror. The interference fringe pattern formed on camera 6 is converted by the camera into an electrical signal which is read one pixel at a time, so that the intensity data at that pixel can be compared to the inserted phase step (by phase modulator 43') to obtain an accurate phase map.

The control processor uses these electrical signals to generate a map of optical path difference (OPD) of the entire optical field prior to and during exposure. The OPD map provides a direct indication of wafer warpage, distortion due to thermal effects or distortion due to previous process steps. For example, if the wafer bows up or down, crinkles or shows local deformation within the spatial resolution, it will be displayed as a change in the OPD map. For measurement of lateral expansion it is necessary to have precise marks, such as those used for alignment, to observe. The interferometer subsystem continuously monitors the wafer during exposure permitting thermal effects to be detected as a change in the OPD map.

Control processor 50 compares the OPD map to a selected standard to determine the amount of change required to achieve the desired surface topography then provides drive signals to vary wafer flatness using deformable chuck 38 or adjusting for aberrations in the optical train by manipulating the deformable turning mirror 48.

Figure 2:
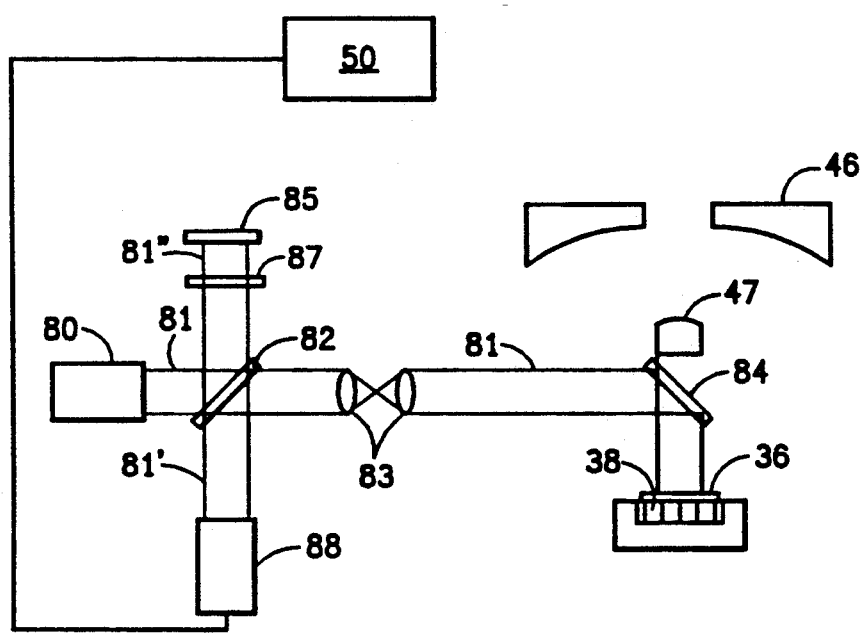
FIG. 2 is a diagrammatic view of an additional interferometer for wafer monitoring.

A second interferometer subsystem, shown in FIG. 2, may be used in place of or in addition to interferometer subsystem 2. The second subsystem looks at wafer 36 separately, apart from the optical train. Substitution by the second system is particularly applicable where the wafer stepper has only a deformable wafer chuck 38. The use of both interferometer systems makes it possible to distinguish between aberrations introduced in the optical train and warpage of the wafer 36.

The configuration of the second interferometer subsystem is similar to that of subsystem 2. Reference laser 80 projects beam 81 which is split by beamsplitter 82 into beams 81' and 81. Beam 81'' is reflected from mirror 85 and passes twice through variable delay element 87. Element 87 is either an electro-optic device or two thin sheets of glass tilted at a small angle to beam 81''. Element 87 has four settings which differ in total optical path difference by one-quarter of a wavelength. Beam 81 is projected through focusing lenses 83 to mirror 84 and onto wafer 36. Light reflected off the wafer face returns to beamsplitter 82 where it combines with beam 81' to form an interference fringe which is detected by camera 88, converted into an electrical signal and fed to control processor 50 for comparison and correction of wafer flatness as above.

Backscatter subsystem 20 is used to provide realtime monitoring of the exposure parameters including resist characteristics, focus, exposure pattern sharpness, registration, alignment and critical dimensions.

Figure 3:
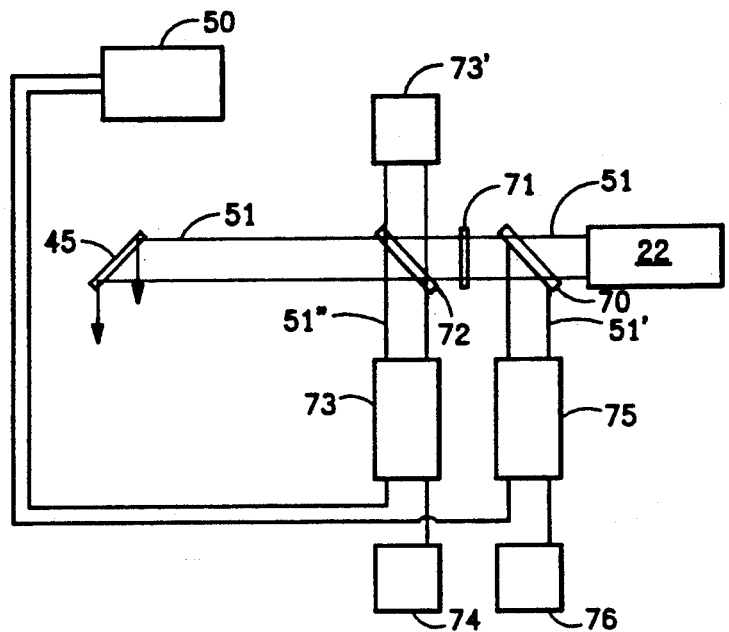
FIG. 3 is a diagrammatic view of the system for use of backscattered light to monitor pattern exposure and related parameters.

As illustrated in FIG. 3, illumination laser 22 projects beam 51 toward reticle 71. Beam 51 continues toward deformable turning mirror 48 and the optical train and wafer 36. The backscattered light which carries the reflected patterned image from the wafer surface is directed by the optical train back to beamsplitter 72 which directs beam 51'', a portion of backscattered beam 51, toward detector array 73. The remaining portion of backscattered beam 51 passes through beamsplitter 72 and reticle 71 to be redirected as beam 51' toward detector array 75. Detector array 73' provides a measurement means for determining intensity of backscattered light which is reflected by reticle 71 rather than transmitted. Detector array 75' measures the intensity of the incident light directly out of the laser 22.

From the backscattered light reflected from wafer 36 photoresist characteristics can be determined from the amount of reflectance and how it changes during exposure. As the photoresist is exposed, the photoresist will bleach and its spatial absorption will change, i.e., it absorbs less light. The spatial absorption can be monitored by comparing the light intensity read at detector array 73 to the light intensity read at detector array 75. The optical characteristics of the resist, such as refractive index and absorption, will have been previously determined. The intensity of the backscattered light at the beginning of an exposure pulse train (upon initiation of exposure) compared to the incident light intensity (read at detector array 73') and the ratio of the intensities of reflected light as received at detector arrays 73 and 75 to the incident light are compared by control processor 50 to a predetermined control value of absorption changes for the particular resist being exposed.

Each detector array 73 and 75 comprises a plurality of cameras and detectors, and permits direct monitoring of the reflected image by the operator. A microscope may be included to permit monitoring of the light irradiation pattern as seen at the surface of the photoresist and as related to the interferometric imagery.

Connected to each detector array 73 and 75 are recording electronics 74 and 76, respectively, to permit collection of signals generated by the cameras and detectors. These signals may be stored in memory, displayed or printed out as required.

Figure 4:
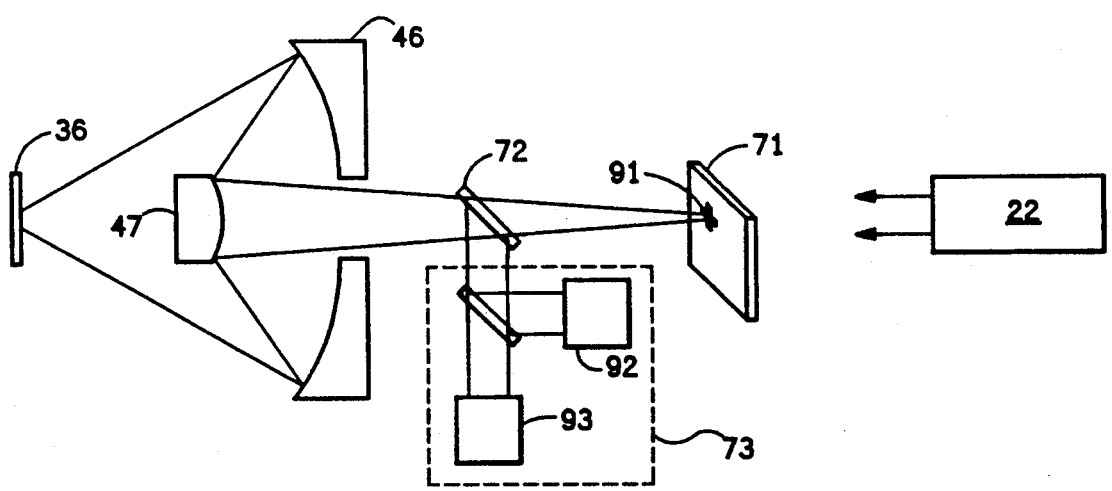
FIG. 4 is a diagrammatic view of a first embodiment of the elements of the backscatter subsystem used for focus determination.

Focus is determined by comparing reference patterns 91 on the reticle 71 to similar reference patterns on the wafer 36, as shown in FIG. 4. The image collected of the backscattered light is compared to the reticle pattern in terms of sharpness and size. The image can be examined at two slightly different axial positions, as measured at detectors 92 and 93 within detector array 73 to determine best focus. By comparing the two images of the reference pattern 91 as detected at detectors 92 and 93, the best focus is obtained. It would be preferred that more than one reference pattern 91 be placed on both the reticle 71 and the wafer 36 so that focus across the wafer can be verified.

For a stepper equipped with a deformable wafer chuck 38, the backscattered image of an isolated reference point on the wafer 36 is taken upstream from the reticle 71, which has a corresponding reference pattern, e.g., a slit, as shown in FIG. 5a (a perspective view of the reticle is provided to illustrate an exemplary reference slit). The backscattered light is deflected by beamsplitter 70 to a detector 94 within detector array 75 to measure the intensity of backscattered light transmitted through the reticle. The signal from detector 94 is sent to control processor 50 which drives the deformable chuck 38 to vary the height of the region of the wafer within the field of view until peak transmission through the reference pattern on the reticle (maximum intensity at detector 94) is achieved. The graph of FIG. 5b illustrates the relatively simple method of qualitatively determining best focus by tuning for peak transmission.

One method of determining exposure pattern sharpness is to take selected portions of the backscattered image as detected by camera 92 within detector array 73, illustrated in FIG. 4. Camera 92 is a CCD camera or any other type of detector which can digitize the reflected image and send it to control processor 50 for comparison to an ideal pattern which has been stored in the computer.

Alternatively, the image may be obtained after it has passed through reticle 71 (by detector array 75) or been reflected off the reticle (by detector array 73', as shown in FIG. 3). By comparing the amount of light after filtering by transmission through or reflection by the reticle, the image sharpness is obtained and compared to the control value. Since the backscattered image pattern at the reticle represents a two-way convolution of the imaging properties of the optical train, the light received is analyzed to determine the actual image pattern on the photoresist. The analysis assumes that the bulk of the backscatter is from the surface of the photoresist, even with resist saturation.

Figure 6:
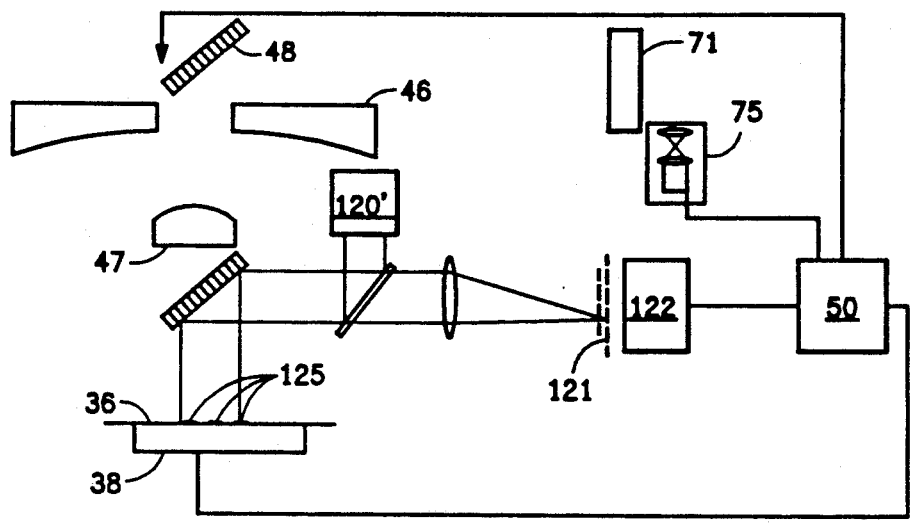
FIG. 6 is a diagrammatic view of the elements of the backscatter subsystem used for initial registration and alignment.

As illustrated in FIG. 6, by observing backscattered light from designated features in the scribe lanes of the wafer, it is possible to verify registration against corresponding features on the reticle or on a separate detection mask 121 which uses a reference laser 120' for illuminating the features at a visible wavelength. A sample registration mark could be a small disc 125 of exposed silicon or aluminum which is surrounded by guard rings or other structures which will assure that the photoresist over the disc is thin. The light backscattered from the disc would have a slightly higher intensity so that its image as reflected toward the reticle 71 or mask 121 would be a dot. Centroid operations are performed to determine the center of the disc on the wafer in an effort to center the dot on the corresponding reflective or transmissive feature on the reticle 71, or on the corresponding transmissive feature on mask 121. Where the reticle is used, if the corresponding feature is reflective, comparison of the matching of the dot and the reflective feature takes place as detected by a centroid detection system within detector array 73. If the corresponding reticle feature is transmissive, comparison of the matching of the dot and the transmissive feature is detected by a centroid detection system within detector array 75. Where a detector mask 121 is used, detector 122 is used to detect and provide a signal to the control processor. The use of the separate detector mask 121 and detector 122 is illustrated in FIG. 6. Deformable turning mirror 48 is adjusted in response to a detected mis-registration to bring the optical train 3 into rough alignment with the reticle 71. Centroid measurement against the transmissive or reflective feature of the reticle as compared to the dot can also be used to provide evidence of relative mask or wafer distortion.

Alignment verification and fine alignment is accomplished by looking at an alignment pattern, usually in the scribe lane of the wafer 36, through a transmission mask or a first order blocking mask at the reference wavelength of laser 120. An exemplary alignment pattern is a set of alternating reflecting and absorbing marks 97 on the wafer 36, as shown in FIG. 7, however buried phase gratings may also be used (nominal 10-20 micron period). (The reticle 71 and wafer 36 are shown in perspective to illustrate an exemplary configuration of the alignment pattern.) The image of the backscattered light from reflecting marks 97 and the photoresist above are imaged onto a corresponding transmission mask on reticle 71. The intensity of light transmitted through the transmission mask as detected by detector 99 in detector array 75 will indicate the degree of overlap of the backscattered image with the transmission mask, alignment being attained when the detected light is at its maximum intensity. Grooves on the substrate may also be used for alignment mark 97 to enhance return contrast. In addition, fluorescence of the resist can be used to provide a signature of the backscattered light with offset wavelengths.

The alignment measurement procedure is used to provide a signal via the process controller to rotate deformable turning mirror 48, thereby providing fine control to bring the wafer into alignment without requiring movement of the stage which, because of its weight, moves slowly and requires a substantial amount of mechanical compensation to adjust the stage.

Figure 9:
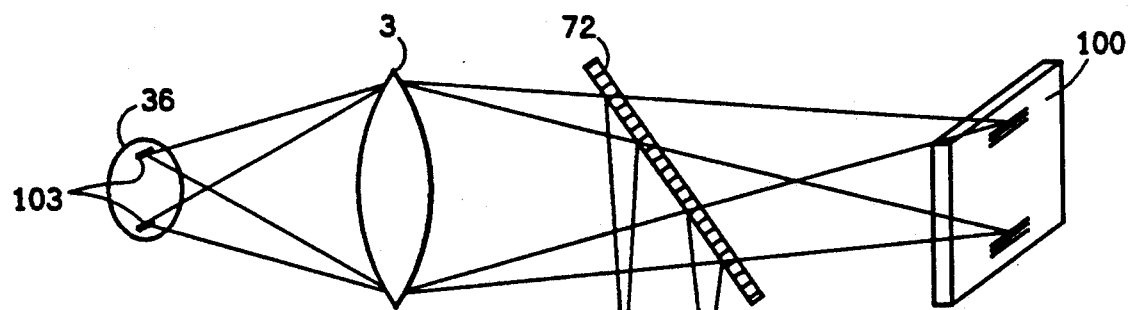
FIG. 9 is a diagrammatic view of additional elements used for critical dimension determination.

Measurement of lateral dimensions (separation of two features) is achieved by looking at the backscattered images of the alignment marks 97 and the registration discs and comparing those images against a reticle or equivalent reference. For example, an equivalent reference would be a plate 100, as shown in FIGS. 8 and 9, with marks 101 corresponding to the reflective features 103 on the substrate as well as selected regions 102 of the projected image on the photoresist surface overlying an absorbing substrate. The properties of the aerial image, i.e., the image created in air at the focal point of the optical train if no target is present, may be measured against a reference surface, as well as the placement of the aerial image relative to marks on the substrate. The absolute difference in separation between selected regions 102 of the projected image is compared with the marks 101 on plate 100 and the measurement of separation between the reflective features 103 on the substrate projection of the combination of those images being filtered by transmission grating 105 on reference plate 104, to determine lateral dimensions.

Figure 10:
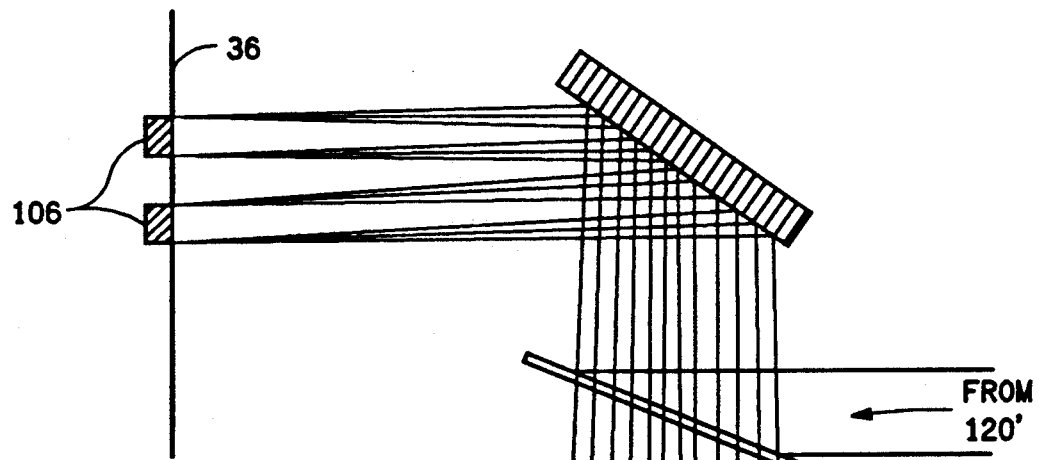
FIG. 10 is a diagrammatic view of the elements used for determining changes in absolute dimensions during exposure.

As illustrated in FIG. 10, light from laser 120 illuminates grating marks 106 on wafer 36. The light reflected from 36 passes through a spatial filter comprising 2 lens or multiple lens components 116' and a blocking filter 116 which passes only the $\pm 1$ orders in the x+y directions. Upon recollimation after the second 116' component, the light coming from the separate marks 106 is spatially separated and light coming from one of the marks passes through angle modulator 117. A final focusing element 116' combines light at detector plane 111 and the phase shift in the resulting AC electrical signal is monitored over the course of the exposure. Any change in the measured phase shift indicates a change in relative wafer dimensions.

Figure 12:
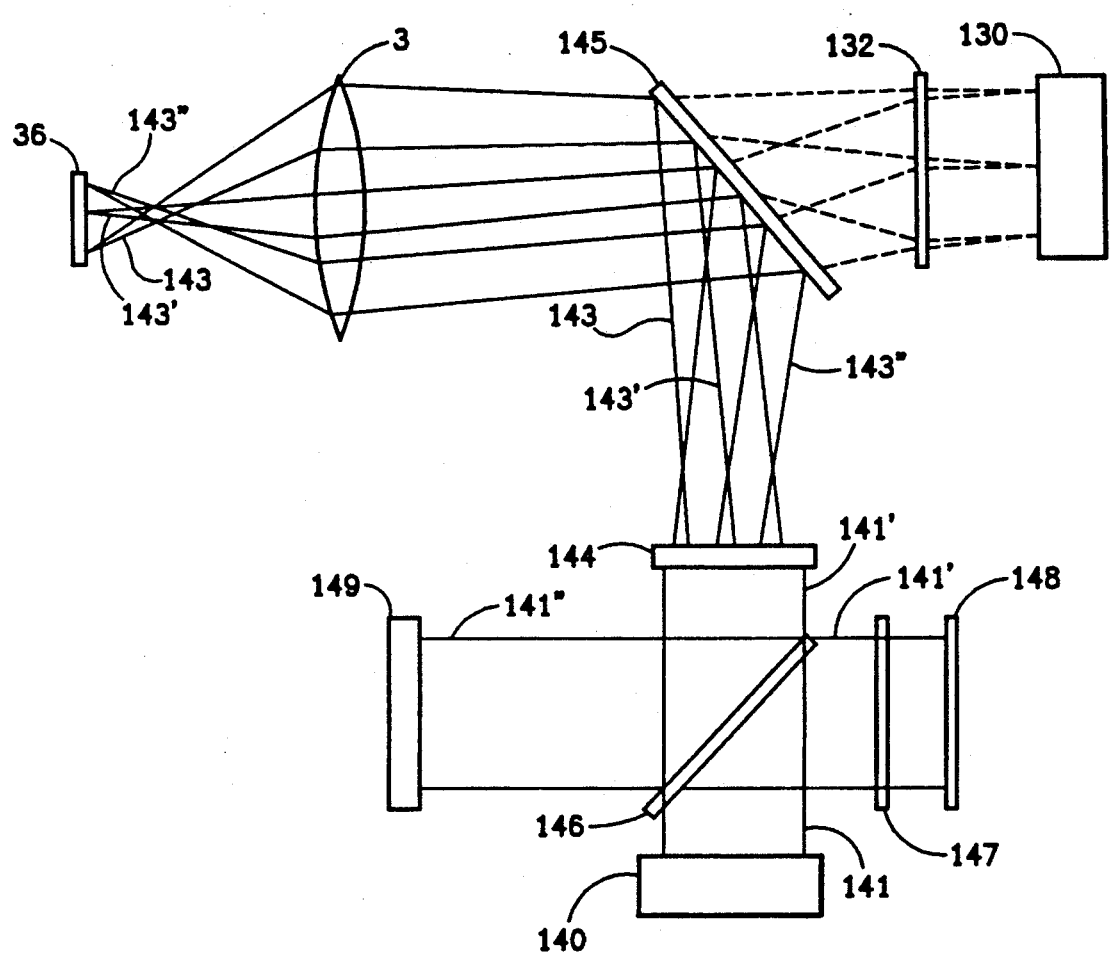
FIG. 12 is a diagrammatic view of elements used for observation of critical dimensions.

FIG. 12 illustrates an optics configuration and method for linewidth measurement during and after exposure using backscattered light. An UV image detector 130 receives a portion of backscattered light from the wafer 36 at the exposure wavelength. The image carried by the backscattered UV light includes a measurement pattern having features with the process's minimum dimensions as well as larger lines for comparison if desired. These imaged lines may either be compared to a reference mask 132 or measured using a scanning linewidth measurement technique as is known in the art.

Accurate linewidth measurement can be obtained adding a sub-field aberration evaluation scheme. A reference laser 140 has its beam 141 split at beamsplitter 146 into 141' and 141''. Beam 141' passes through a plate 144 having a plurality of lenses, each lens of which takes a portion of beam 141' and focuses it at a different focal point, e.g., beams 143, 143' and 143''. Plate 144 may contain multiple Fresnel zone plates or an array of standard focusing lenses may be used. Beams 143, 143' and 143'' are split at beamsplitter 145 causing a portion of the beams to go forward through lens 3 to impinge upon wafer 36 and be reflected to retrace the same path, returning to beamsplitter 145. A different sub-field on wafer 36 is illuminated by each of beams 143, 143' and 143'' so that the image carried by each beam is representative of the portion of the lens 3 through which it passed and the point illuminated on wafer 36. A portion of the backscattered light is directed back through mask 132 which contains the images corresponding to the points illuminated on the wafer to provide the measurement as above. The remaining backscattered light from the reference laser is deflected back through plate 144 to be deflected again by beamsplitter 146 toward detector 149. Mirror 148 in combination with modulator 147, which inserts fractional wave steps in the reference beam, modifies the beam path to attain the desired phase of the reference beam. The modulated light reflected by mirror 148 passes through beamsplitter 146 to be combined with beam 141'', the portion of incident beam 141 directed toward the detector 149. This combination results in a number of interference fringes which, when modulated by modulator 147 and detected by detector 149, produce a phase map to indicate phase distortion in the optical train at different localized sub-fields of the illumination field. The phase map may then be analyzed to determine the correctness of mask reproduction on the wafer at a given sub-field by subtracting the localized aberrations from the image received at detector 130. Aberrations across a field change on the order of every 1 cm so a sub-field 1 cm in diameter can be presumed to possess approximately the same aberration, so that any features sought to be measured within the sub-field can be properly evaluated by subtracting the aberration. Measurement of linewidth permits selection of exposure conditions, such as laser scan speed and dose, to control linewidth as exposure occurs.

Figure 11:
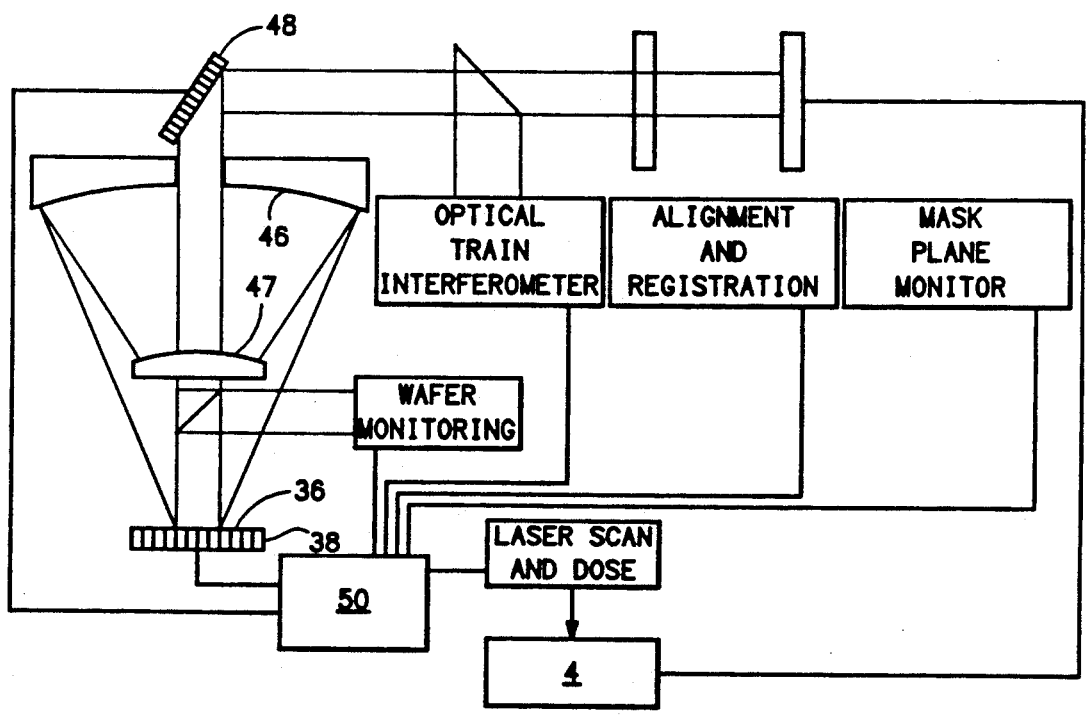
FIG. 11 is a block diagram summarizing the measurements of which the system is capable.

The above-described optical systems and methods permit realtime inspection, monitoring and analysis of wafer flatness, position alignment, registration and dimension changes for steppers. Where adjustable components are included in the stepper design, the realtime information can be used to correct and vary the machine's performance. FIG. 11 provides a diagrammatic summary of the measurement sites and their functions.

It will be evident that there are additional embodiments which are not illustrated above but which are clearly within the scope and spirit of the present invention. The above description and drawings are therefore intended to be exemplary only and the scope of the invention is to be limited solely by the appended claims.

We claim:

1. A process control system for a wafer stepper for monitoring conditions which affect exposure across an entire optical field before, during and after projection of an illumination beam carrying a pattern from a reticle through an optical train to be focused on a wafer, said wafer being at least partially reflective, said process control system comprising:
    an interferometric subsystem comprising:
        at least one reference laser for emitting a reference beam;
        at least one reference beamsplitter for redirecting a portion of said reference beam;
        a plurality of optical elements for directing said reference beam into a common path with said illumination beam through said optical train, said plurality of optical elements further directing a reflected reference beam to retrace said common path and return to said at least one reference beamsplitter;
        at least one detector array for receiving an interference fringe generated by a combination of said portion of said reference beam and said reflected reference beam and said reflected reference beam, said at least one detector array generating a first set of electrical signals corresponding to said interference fringe; and
        a control processor for receiving and analyzing a plurality of electrical signals and generating a plurality of output signals therefrom, wherein said first set of electrical signals is analyzed to determine a first set of exposure conditions comprising at least one first optical path difference map.

2. A process control system as in claim 1 further comprising:
    a backscatter subsystem comprising:
        an illumination light source for projection of said illumination beam;
        a plurality of features patterned on a reference plate disposed in a path of said illumination beam;
        at least one illumination beamsplitter disposed in said path of said illumination beam, said illumination beamsplitter for redirecting a portion of said illumination beam;
        a detector array for each said illumination beamsplitter for receiving said portion of said illumination beam and a reflected illumination beam;
        said reflected illumination beam being reflected from said wafer on which is formed a plurality of image features corresponding to said plurality of features, said reflected beam carrying an image of each said image feature back along said path of said illumination beam and comparing said portion of said illumination beam with said reflected illumination beam to determine a second set of exposure conditions.

3. A process control system as in claim 1 further comprising a second interferometric subsystem for generation of an interference fringe for measurement of a third set of exposure conditions on said wafer independent of said optical train, said second interferometric subsystem generating a second set of electrical signals.

4. A process control system as in claim 3 further comprises a deformable mirror for correcting aberrations and distortion, said deformable mirror being driven by a first group of one or more output signals from said plurality of output signals.

5. A process control system as in claim 4 wherein said deformable mirror is turnable, turning of said deformable mirror being driven by said process controller in response to a first group of said second set of exposure conditions.

6. A process control system as in claim 1 further comprising a deformable wafer chuck for manipulating the flatness of said wafer, said deformable water chuck being driven by a second group of one or more output signals from said plurality of output signals.

7. A process control system as in claim 2 wherein an illumination beamsplitter is disposed downstream from said reference plate.

8. A process control system as in claim 2 wherein an illumination beamsplitter is disposed upstream from said reference plate.

9. A process control system as in claim 2 wherein said reference plate is combined with said reticle.

10. A process control system as in claim 2 wherein said illumination beam is generated by an exposure laser.

11. A process control system as in claim 2 wherein said illumination beam is generated by a laser emitting light in the visible spectrum.

12. A process control system as in claim 2 wherein said second set of exposure conditions are sent to said control processor which further provides at least one third group of one or more output signals for display and storage of said second set of exposure conditions.

13. A process control system as in claim 3 wherein said second interferometric subsystem sends said second set of electrical signals to said control processor.

14. A process control system as in claim 13 wherein said second set of electrical signals is converted by said control processor into a fourth group of one or more output signals for driving said deformable wafer chuck.

15. A process control system as in claim 13 wherein said second set of electrical signals is converted by said control processor into a fifth group of one or more signals to control the turning of said deformable mirror.

16. A process control system for a wafer stepper for inspecting conditions before exposure, for monitoring conditions during exposure of a wafer by projection of an image from a patterned reticle and for controlling adjustment of said wafer stepper comprising:
    a first interferometric subsystem having a first reference laser to generate an optical path difference map to determine aberrations within an optical train and for measuring warpage and surface conditions of said wafer;

a backscatter subsystem using illumination from a light source used for exposure, and using said optical train and a plurality of beamsplitters and corresponding detectors to compare a plurality of features on said wafer against a plurality of corresponding features on a reference plate; and a process controller for receiving signals generated by said first interferometric subsystem and said corresponding detectors of said backscatter subsystem, said process controller generating information therefrom of said conditions before exposure, said conditions during exposure and providing signals for controlling adjustment of said wafer stepper.

17. A process control system as in claim 16 further comprising a second interferometric system having a second reference laser for measuring warpage and surface conditions of said wafer independent of said optical train.

18. A process control system as in claim 16 wherein said backscatter system further comprises a second illumination light source directed through said optical train to compare said plurality of features on said wafer against a reference.

19. A process control system as in claim 16 further comprising a deformable wafer chuck for selective deformation in response to a first group of said signals.

20. A process control system as in claim 13 further comprising a deformable turning mirror for selective deformation and turning in response to a second set of said signals.

21. A method of process monitoring and control of a wafer stepper which comprises:

generating a first optical path difference map to determine aberrations and distortions within an optical train of said wafer stepper;

generating a second optical path difference map to determine warpage and surface conditions of a wafer being processed on said wafer stepper;

directing light from an illumination light source along a common optical path with an exposure light source;

detecting backscattered light of said illumination light source reflected by said wafer and comparing an image carried by said backscattered light against a reference; and analyzing a plurality of electrical signals corresponding to said first optical path difference map, said second optical path difference map and said backscattered light of said illuminating light source to generate information therefrom of process conditions of said wafer stepper.

22. A method of process monitoring and control as in claim 21 further comprising detecting backscattered light of said exposure light source reflected by said wafer and comparing an image carried by said backscattered light of said exposure light source against a second reference.

23. A method of process monitoring and control as in claim 22 further comprising analyzing a plurality of electrical signals corresponding to said backscattered light of said exposure light source to generate information therefrom of process conditions of said wafer stepper.

24. A method of process monitoring and control as in claim 21 further comprising using information generated by analyzing the plurality of electrical signals to adjust said wafer stepper to attain a desired condition.

25. A process control system as in claim 1 wherein said at least one first optical path difference map comprises a representation of wafer flatness.

26. A process control system as in claim 1 wherein said at least one first optical path difference map comprises a representation of optical field curvature.

27. A method of process monitoring and control of a stepper before, during and after exposure of a target, said stepper having an optical train, the method which comprises:

splitting at least one reference beam into a first portion and a second portion;

defining an optical field by projecting said first portion of said at least one reference beam through said optical train and onto said target from which said first portion is at least partially reflected;

recombining the reflected first portion with said second portion to generate interference fringes;

measuring said interference fringes to determine phase differences across said optical field; and generating at least one phase map representation of target flatness and curvature of said optical field.

28. A method of process monitoring and control as in claim 27 further comprising:

generating an electrical signal from said at least one phase map; and deforming said target to compensate for errors in target flatness.

29. A method of process monitoring and control as in claim 27 further comprising:

generating an electrical signal from said at least one phase map; and deforming an element within said optical train to compensate for errors in curvature of said optical field.

30. A method of process monitoring and control as in claim 27 further comprising:

directing at least one illumination beam through said optical train;

detecting backscattered light of said at least one illumination beam reflected from said target;

comparing an image carried by said backscattered light against a reference; and generating a plurality of electrical signals representative of process conditions of said stepper.

* * * * *